(12) United States Patent
Fu et al.

(10) Patent No.: US 11,735,286 B2
(45) Date of Patent: Aug. 22, 2023

(54) SELECTING READ REFERENCE VOLTAGE USING HISTORICAL DECODING INFORMATION

(71) Applicant: Innogrit Technologies Co., Ltd., Shanghai (CN)

(72) Inventors: Bo Fu, Cupertino, CA (US); Jie Chen, Milpitas, CA (US); Zining Wu, Los Altos, CA (US)

(73) Assignee: Innogrit Technologies Co., Ltd., Shanghai (CN)

( * ) Notice: Subject to any disclaimer, the term of this patent is extended or adjusted under 35 U.S.C. 154(b) by 0 days.

(21) Appl. No.: 17/490,304

(22) Filed: Sep. 30, 2021

(65) Prior Publication Data

US 2023/0098775 A1  Mar. 30, 2023

(51) Int. Cl.

| G11C 16/26 | (2006.01) |
|---|---|
| G11C 29/42 | (2006.01) |
| G11C 29/44 | (2006.01) |
| G11C 11/4096 | (2006.01) |
| G11C 11/4099 | (2006.01) |
| G11C 29/18 | (2006.01) |

(52) U.S. Cl.
CPC .......... *G11C 29/42* (2013.01); *G11C 11/4096* (2013.01); *G11C 11/4099* (2013.01); *G11C 29/18* (2013.01); *G11C 29/4401* (2013.01); *G11C 2029/1802* (2013.01)

(58) Field of Classification Search
CPC ...................................................... G11C 29/42
See application file for complete search history.

(56) References Cited

U.S. PATENT DOCUMENTS

| 9,785,357 | B2 * | 10/2017 | Raghu | ................... | G11C 29/021 |
| 9,916,237 | B2 * | 3/2018 | Hyun | ................... | G06F 12/0246 |
| 2012/0059979 | A1 * | 3/2012 | Aoyagi | ................ | G11C 29/883 |
| | | | | | 711/E12.008 |
| 2018/0067697 | A1 * | 3/2018 | Lee | ....................... | G11C 11/5642 |
| 2020/0058359 | A1 * | 2/2020 | Lee | ..................... | G11C 16/3495 |

* cited by examiner

*Primary Examiner* — Min Huang
(74) *Attorney, Agent, or Firm* — IPro, PLLC (57) ABSTRACT

Systems and methods are provided for reading data from non-volatile storage devices and decoding the read data. A method may include obtaining a unique identifier for a storage location to be read, retrieving from a memory an adjustment to read reference voltage (Vref) associated with the unique identifier, performing a read operation on the storage location using a read reference voltage adjusted by the adjustment to Vref, decoding data read from the storage location in a decoding process and updating the adjustment to $V_{ref}$ with decoding information generated during the decoding process.

15 Claims, 6 Drawing Sheets

SELECTING READ REFERENCE VOLTAGE USING HISTORICAL DECODING INFORMATION

TECHNICAL FIELD

The disclosure herein relates to reading data from non-volatile storage devices and decoding the data, particularly relates to selecting read reference voltage using historical information collected from previous decoding operations.

BACKGROUND

The evolution of the modern computing system is driven in-part by the emergence of the Solid State Drives (SSDs) that have demonstrated higher performance of speed and latency over the traditional hard drives. Unlike hard drives that depend on the magnetism to store data, solid state drives use non-volatile memory (e.g., NAND or NOR) devices to achieve data storage. The non-volatile memory devices are a family of integrated circuits that are manufactured by advanced process and assembly technologies to achieve multiple levels of vertical stacking of storages units into a small footprint of die and package for high capacity of storage.

One issue for all storage systems is corruption of data. One technique to remedy the data corruption is to use an error-correcting code (ECC) or forward error correction (FEC) code. A lot of different coding schemes have been developed over the years, for example, Hamming codes, Reed-Solomon codes, Turbo codes, low density parity check (LDPC) codes, etc. A controller with a sophisticated ECC algorithm is likely to use a lot of resources, and thus techniques to achieve a low error rate are still in need of improvements.

SUMMARY

The disclosed subject matter relates to systems, methods, and devices for a non-volatile storage system to achieve a low error rate by selecting suitable read reference voltage based on historical decoding information. In an exemplary embodiment, there is provided a method that may comprise obtaining a unique identifier for a storage location to be read, retrieving from a memory an adjustment to read reference voltage ($V_{ref}$) associated with the unique identifier, performing a read operation on the storage location using a read reference voltage adjusted by the adjustment to $V_{ref}$, decoding data read from the storage location in a decoding process, and updating the adjustment to $V_{ref}$ with decoding information generated during the decoding process.

In another embodiment, there is provided a storage system controller that may comprise a logical data address (LDA) to physical data address (PDA) mapper configured to obtain a PDA for a LDA, a read reference voltage ($V_{ref}$) search controller configured to retrieve from a memory an adjustment to $V_{ref}$ associated with the PDA, a NAND interface controller configured to issue a read command to read a storage location identified by the PDA, one or more ECC decoders configured to decode data read by the read command in a decoding process, and a $V_{ref}$ update controller configured to update the adjustment to $V_{ref}$ with decoding information generated during the decoding process.

In yet another exemplary embodiment, disclosed herein may also include a non-transitory machine-readable medium having executable instructions. The executable instructions, when executed by a storage controller, may cause the storage controller to: obtain a unique identifier for a storage location to be read, retrieve from a memory an adjustment to read reference voltage ($V_{ref}$) associated with the unique identifier, perform a read operation on the storage location using a read reference voltage adjusted by the adjustment to $V_{ref}$, decode data read from the storage location in a decoding process, and update the adjustment to $V_{ref}$ with decoding information generated during the decoding process.

DETAILED DESCRIPTION

Specific embodiments according to the present disclosure will now be described in detail with reference to the accompanying figures. Like elements in the various figures are denoted by like reference numerals for consistency.

Figure 1:
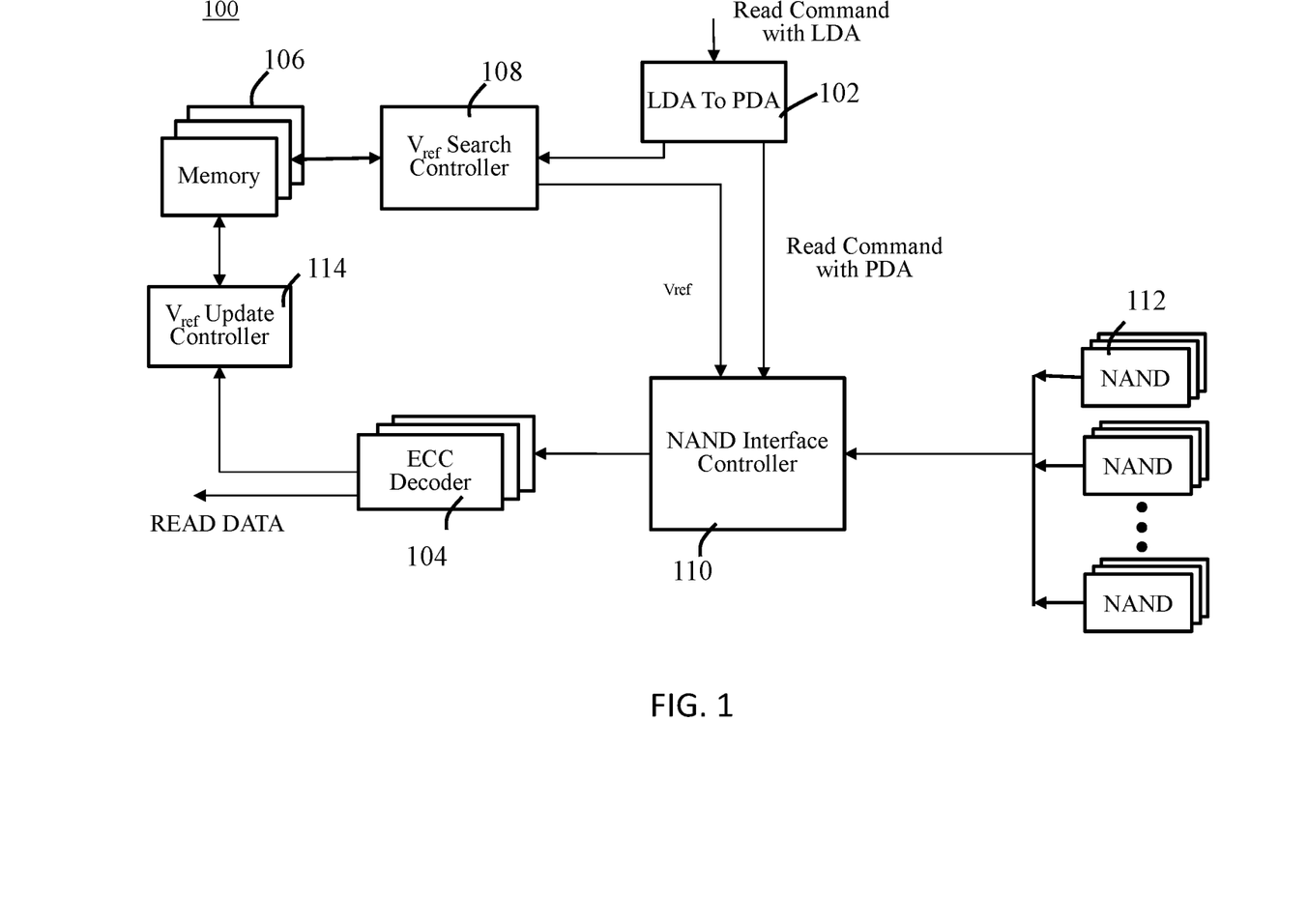
FIG. 1 schematically shows a non-volatile storage system in accordance with an embodiment of the present disclosure.

The present disclosure provides apparatuses, systems and methods for reading data stored in non-volatile memory (NVM) storage devices that are encoded with an error-correcting code (ECC). FIG. 1 schematically shows a non-volatile storage system 100 in accordance with an embodiment of the present disclosure. The non-volatile storage system 100 may comprise a Logical Data Address (LDA) to Physical Data Address (PDA) mapper 102, one or more ECC decoders 104, a memory 106, a read reference voltage ($V_{ref}$) search controller 108, a NAND interface controller 110, a plurality of NAND devices 112, and a $V_{ref}$ update controller 114. The plurality of NAND devices 112 may be coupled to the NAND interface controller 110 via one or more channels. In one embodiment, a channel may comprise more than one NAND device. The memory 106 may comprise one or more memory modules.

In various embodiments, the one or more ECC decoders 104 may include decoder circuitry for hard decision decoding and soft decision decoding. For example, the one or more ECC decoders 104 may comprise one or more hard decision decoders and one or more soft decision decoders, or one or more decoders that may perform both hard decision decoding and soft decision decoding. The decoder circuitry for hard decision decoding may be any suitable hard decision decoder that implements a hard decision algorithm, including but not limited to, a bit flipping algorithm or any other hard decision technique yet to be developed. And the decoder circuitry for soft decision decoding may be any suitable soft decision decoder that implements a soft decision algorithm, including but not limited to, any conventional soft decision algorithm based on belief propagation known in the industry (e.g., sum-product algorithm ("SPA"), min-sum algorithm, stochastic decoding algorithm, or their variations) or any other soft decision algorithms yet to be developed. For example, in one embodiment, the one or more ECC decoders 104 may include a min-sum decoder, which can operate in a single-bit hard decision (HD) mode and a multiple-bit information soft decision (SD) mode.

Soft information to be used by the decoder circuitry for soft decision decoding may be conventional soft information obtained by reading the same data from the NAND devices multiple times, soft information generated from historical decoding processes, or both. For example, in one embodiment, soft information may be generated and/or updated after each decoding process and stored in the memory 106. If soft information cannot be found in the memory 106, conventional soft information may be obtained from the NAND devices and forwarded to the decoder circuitry for soft decision decoding at the one or more ECC decoders 104.

During operations of the non-volatile storage system 100, a read command with a logical data address (LDA) may be received from a host. The read command with LDA may be forwarded to the LDA to PDA mapper 102 to obtain a PDA mapped to the LDA. The LDA to PDA mapper 102 may be a circuit block configured to mapping LDAs to PDAs. The data address in the LDA and PDA may depend on the granularity of data unit, for example, a PDA may be a physical block address (PBA) point to the physical storage location of a block in the NAND devices 112, or a physical page address (PPA) point to the physical storage location of a page in the NAND devices 112. A page may be a storage space for a plurality of ECC codewords and the PDA may be a unique identifier that may uniquely identify the page location. A block may be a storage space for a plurality of pages and the PDA may be a unique identifier that may uniquely identify the block location.

Data stored in the NAND devices 112 may be read by applying a $V_{ref}$ to the storage cells. A proper NAND $V_{ref}$ is critical to achieve a low error rate of storage systems using NAND flash memory. In the non-volatile storage system 100, the PDA may be sent to the $V_{ref}$ search controller 108, which may use the PDA to search the memory 106 for an adjustment to $V_{ref}$ associated with the PDA. The adjustment to $V_{ref}$ and a read command with the PDA may be sent to the NAND interface controller 110.

The one or more ECC decoders 104 may decode each data block obtained from the NAND devices 112. Decoding information may be generated at the one or more ECC decoders 104 each time the one or more ECC decoders 104 decodes data read from a physical storage location of the NAND devices 112. For example, during a decoding operation, some bits may be flipped and some are not. This may be useful decoding information. The $V_{ref}$ update controller 114 may receive the decoding information from the one or more ECC decoders 104 and update the adjustment to $V_{ref}$. The updated adjustment to $V_{ref}$ may be saved in the memory 106. The memory 106 used to store adjustment to $V_{ref}$ may be Static Random-Access Memory (SRAM), Double Data Rate RAM, or MRAM or any storage that may have a much shorter read latency than NAND device.

In one embodiment, the non-volatile storage system 100 may be a solid-state drive (SSD). Moreover, in one embodiment, the LDA to PDA mapping circuit block 102, the one or more ECC decoders 104, the $V_{ref}$ search controller 108, the NAND interface controller 110 and the $V_{ref}$ update controller 114 may be part of a storage system controller and incorporated in one storage system controller chip (e.g., an integrated circuit (IC) chip), while the memory 106 and the plurality of NAND devices 112 may be coupled to the storage system controller chip. In another embodiment, the memory 106 may also be integrated into the chip of the storage system controller.

Figure 2A:
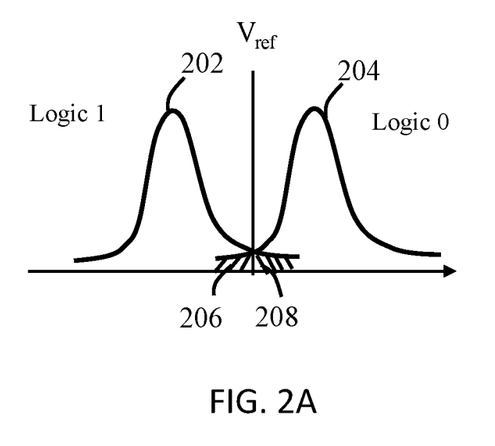
FIG. 2A, FIG. 2B and FIG. 2C schematically show the effect of shift of the threshold voltage values of NAND flash memory cells in accordance with an embodiment of the present disclosure.
Figure 2B:
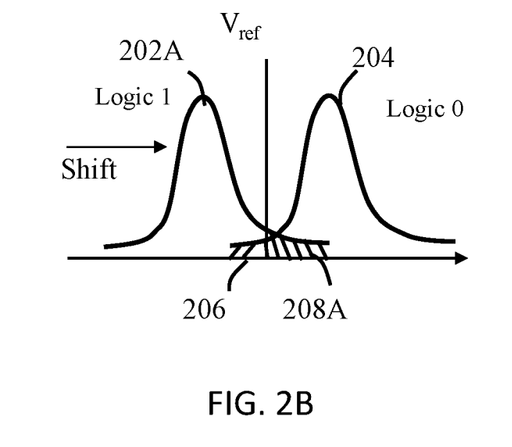
Figure 2C:
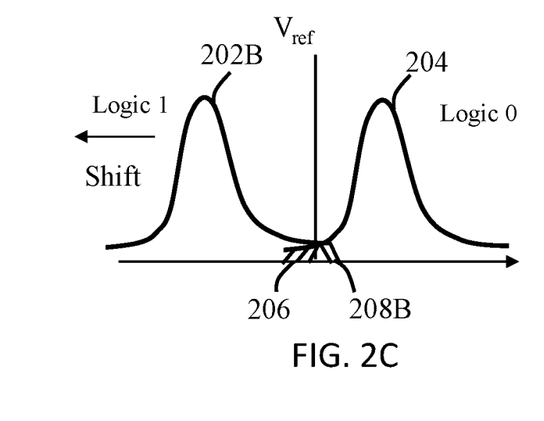

FIG. 2A, FIG. 2B and FIG. 2C schematically show the effect of shift of the threshold voltage values of NAND flash memory cells and how adjustment to $V_{ref}$ generated from past decoding processes may be applied to subsequent read operations in accordance with an embodiment of the present disclosure. The horizontal axis in FIG. 2A, FIG. 2B and FIG. 2C may be the threshold voltage of storage cells in a NAND device. The vertical axis in FIG. 2A, FIG. 2B and FIG. 2C may be the probability distribution function of the threshold voltages of storage cells.

The curve 202 in FIG. 2A may indicate readout of a first logic state, for example, logic one. The curve 204 in FIG. 2A may indicate readout of a second logic state, for example, logic zero. Readout used herein may refer to any given cell's readout voltage and any given bit may be assigned a logic state by comparing this readout voltage to the $V_{ref}$.

As shown in FIG. 2A, the curve 202 may have a tail portion 208 extending past the $V_{ref}$ into the territory that may be regarded as in the second logic state, and the curve 204 may have a tail portion 206 extending past the $V_{ref}$ into the territory that may be regarded as in the first logic state. That is, the correct logic state for bits with their readout in the tail portion 206 may be the second logic state but because these bits' threshold voltages are smaller than the $V_{ref}$ they may be regarded as the first logic state. At the same time, the correct logic state for bits with their readout in the tail portion 208 may be the first logic state but because these bits' threshold voltages are larger than the $V_{ref}$ they may be regarded as the second logic state.

In embodiments, during a decoding process, the incorrectly labeled bits may be corrected. That is, during a decoding process, the bits with readouts in the portion 206 that may be incorrectly labeled as logic state one may be flipped to logic state two and bits with readouts in the portion 208 that may be incorrectly labeled as logic state two may be flipped to logic state one. When the threshold voltage is not shifted, as in FIG. 2A, the sizes of the tail portions 206 and 208 may be close and the number of corrections from logic state one to logic state two may be close to the number of corrections from logic state two to logic state one.

In various embodiments, the threshold voltages of cells may shift. For example, with the increase of use (e.g., increased P/E cycles), threshold voltages of cells may tend to shift to the right. Therefore, if $V_{ref}$ is not shifted accordingly, the difference between the sizes of the tail portions 206 and 208 may become bigger. FIG. 2B shows that the threshold voltages for the logic state one may be shifted to the right a little bit thus the curve 202 of FIG. 2A becomes the curve 202A in FIG. 2B. The right shift of the threshold voltages for the logic state one may cause the tail portion 208 of FIG. 2A become the tail portion 208A in FIG. 2B. Because the shift of the curve 202A is to the right, the tail portion 208A may be larger than the tail portion 208 and thus the tail portion 208A may be larger than the tail portion 206 in FIG. 2B. That is, there may be more bits with their readout voltages in the tail portion 208A than the number of bits in the tail portion 206 of FIG. 2B.

The effect of the threshold voltage shift is that there may be unbalanced corrections between the two logic states. In at least one embodiment, two numbers of flipping may be counted (e.g., by two counters). One number of flipping may record how many bits are flipped from the first logic state to the second logic state (e.g., "1" to "0") during one decoding process for one data block, which may be referred to as error flipping count of 1 to 0, and denoted as $EFC_{1\to 0}$. Another number of flipping may record how many bits are flipped from the second logic state to the first logic state (e.g., "0" to "1") during one decoding process for one data block, which may be referred to as error flipping count of 0 to 1, and denoted as $EFC_{0\to 1}$. In the example of FIG. 2B, $EFC_{0\to 1}$ may be greater than $EFC_{1\to 0}$, and thus $V_{ref}$ may need to be adjusted to the right (e.g., increasing the $V_{ref}$ value) to achieve a balanced $EFC_{0\to 1}$ and $EFC_{1\to 0}$.

It should be noted that FIG. 2B shows an example of the threshold voltages of the logic state one being shifted larger. FIG. 2C shows another example of the threshold voltages of the logic state one being shifted left (e.g., become smaller) thus the curve 202 of FIG. 2A becomes the curve 202B in FIG. 2C. The left shift of the threshold voltages for the logic state one may cause the tail portion 208 of FIG. 2A become the tail portion 208B in FIG. 2C. Because the shift of the curve 202B is to the left, the tail portion 208B may be smaller than the tail portion 208 and thus the tail portion 208B may be smaller than the tail portion 206 in FIG. 2C. That is, there may be less bits with their readout voltages in the tail portion 208B than the number of bits in the tail portion 206 of FIG. 2C. Because in FIG. 2C, $EFC_{0\to 1}$ may be smaller than $EFC_{1\to 0}$, $V_{ref}$ may need to be adjusted to the left (e.g., decreasing the $V_{ref}$ value) to achieve a balanced $EFC_{0\to 1}$ and $EFC_{1\to 0}$.

It should be noted that the threshold voltage shifting in FIG. 2B and FIG. 2C are examples for illustration only. In some other embodiments, the threshold voltages for the logic state two may also shift left or right. Moreover, the shapes of the curves 202 and 204 may change during a shift, for example, the curves 202 and/or 204 may become lower, wider, or both. In these situations, adjusting $V_{ref}$ to get balanced $EFC_{0\to 1}$ and $EFC_{1\to 0}$ may still be critical to achieve a low error rate for the storage system.

Referring back to FIG. 1, at the end of a decoding process, the two error flipping counts $EFC_{0\to 1}$ and $EFC_{1\to 0}$ may be obtained, for example, as part of the decoding information generated by the one or more decoders 104 and forwarded to the $V_{ref}$ update controller 114. The difference between the two numbers (e.g., $EFC_{0\to 1}$ and $EFC_{1\to 0}$) may provide extra information about a NAND device and may be used to adjust $V_{ref}$ for future read of the same storage location and achieve a low error rate for the non-volatile storage system 100. As an example, the error flipping count of 0 to 1 minus the error flipping count of 1 to 0 (e.g., $EFC_{0\to 1}-EFC_{1\to 0}$) may be used as the difference between the two error counts.

It should be noted that there are many other ways to represent the difference between the two error flipping counts (e.g., these two errors flipping counts may switch their positions as $EFC_{1\to 0}-EFC_{0\to 1}$, or the two errors flipping counts squared for comparison $EFC_{0\to 1}^2-EFC_{1\to 0}^2$). The result of whether to increase or decrease $V_{ref}$ may be the same because the adjustment to $V_{ref}$ may depend on which error flipping count is greater and how unbalanced these two counts are.

In some embodiments, the $V_{ref}$ update controller 114 may generate an adjustment for $V_{ref}$ based on historical decoding information and store the adjustment as part of the $V_{ref}$ information to the memory 106. For example, to avoid fluctuating the $V_{ref}$ value after each decoding process of a data block from the same storage location, an average of the difference between $EFC_{0\to 1}$ and $EFC_{1\to 0}$, denoted $\overline{EFC_{0\to 1}-EFC_{1\to 0}}$, over a number of most recent decoding processes for data read from the same storage location may be used to adjust $V_{ref}$. The number of most recent decoding processes used for calculating $\overline{EFC_{0\to 1}-EFC_{1\to 0}}$ may be denoted $T_{avg}$. In some embodiments, a maximum number of most recent decoding processes may be set, which may be denoted as $T_{avg\_max}$.

At the end of a decoding process, a new value of $EFC_{0\to 1}-EFC_{1\to 0}$ may be calculated by the $V_{ref}$ update controller 114 based on decoding information generated by the decoding process just ended. Also, the $V_{ref}$ update controller 114 may search the memory 106, using the unique identifier for the storage location of data being decoded, to obtain a stored $\overline{EFC_{0\to 1}-EFC_{1\to 0}}$ and the $T_{avg}$ used for calculating the stored $\overline{EFC_{0\to 1}-EFC_{1\to 0}}$. If the $T_{avg}$ is smaller than $T_{avg\_max}$, the New $\overline{EFC_{0\to 1}-EFC_{1\to 0}}$ may be calculated by the equation $$\frac{\text{Stored}\overline{(EFC0\to 1 - EFC1 \to 0)} * T_{avg} + \text{New Value of}(EFC_{0\to 1} - EFC_{1\to 0})}{T_{avg} + 1},$$

with "*" as the multiplication operator, and $T_{avg}$ may be updated as $T_{avg}=T_{avg}+1$. If the $T_{avg}$ is equal to $T_{avg\_max}$, the New $\overline{EFC_{0\to 1}-EFC_{1\to 0}}$ may be calculated by the equation $$\frac{\text{Stored}\overline{(EFC0\to 1 - EFC1 \to 0)} * (T_{avg} - 1) + \text{New Value of}(EFC_{0\to 1} - EFC_{1\to 0})}{T_{avg}},$$

with "*" as the multiplication operator and $T_{avg}$ may be kept as $T_{avg}=T_{avg}$.

In some embodiments, a threshold value for $T_{avg}$ (denoted as $T_{avg\_thr}$) and a threshold value for the absolute value for $\overline{EFC_{0\to 1}-EFC_{1\to 0}}$ (denoted as $EFC\_DIFF_{thr}$) may be used to determine whether the $V_{ref}$ need to be adjusted. One exemplary adjustment rule may be as follows. If $T_{avg}$ is greater than $T_{avg\_thr}$ and the absolute value of the average difference (e.g., $|\overline{(EFC_{0\to 1}-EFC_{1\to 0})}|$) is larger than $EFC\_DIFF_{thr}$, the $V_{ref}$ may be shifted to right (e.g., increase) if $EFC_{0\to 1}-EFC_{1\to 0}$ is positive, and the $V_{ref}$ may be shifted to left (e.g., decrease) if $EFC_{0\to 1}-EFC_{1\to 0}$ is negative. Moreover, every time when $V_{ref}$ is adjusted (e.g., the value of the adjustment to $V_{ref}$ is changed), $\overline{EFC_{0\to 1}-EFC_{1\to 0}}$ and $T_{avg}$ may be reset to 0. The adjustment to may be implemented in steps, for example, each time increasing or decreasing by one or more delta ($\Delta$) values. The delta value may be determined by experiments and may be different for different types or brands of NAND devices.

The $V_{ref}$ update controller 114 may set or update the adjustment to $V_{ref}$ based on updated $\overline{EFC_{0\to 1}-EFC_{1\to 0}}$ and $T_{avg}$ after each decoding process, and save the new values (e.g., adjustment to $V_{ref}$, $\overline{EFC_{0\to 1}-EFC_{1\to 0}}$ and $T_{avg}$) to the memory 106 as $V_{ref}$ information associated with the unique identifier for a storage location.

In some embodiments, in addition to updating adjustment to $V_{ref}$ based on historical decoding processes, a controller of the non-volatile storage system 100 may execute firmware that implements one or more algorithms to find an adjustment to $V_{ref}$ by searching for a $V_{ref}$ that has a lower error rate. Moreover, the NAND device 112 may also implement an algorithm to find a better $V_{ref}$. When the one or more decoders 104 successfully decodes data, it does not know whether the adjustment to $V_{ref}$, which is used to read the data from the NAND device 112, comes from the memory 106 or is found by the controller or the NAND device 112. Therefore, in these embodiments, the decoding information sent from the one or more decoders 104 to the $V_{ref}$ update controller 114 may include the adjustment to $V_{ref}$ used to read the data. The $V_{ref}$ update controller 114 may compare the adjustment to $V_{ref}$ received from the one or more decoders 104 to the adjustment to $V_{ref}$ stored in the memory 106. If the adjustment to $V_{ref}$ received from the one or more decoders 104 is different from the adjustment to $V_{ref}$ stored in the memory 106, the $V_{ref}$ update controller 114 may update the memory 106 with the adjustment to $V_{ref}$ received from the one or more decoders 104. Because this may be a new adjustment to $V_{ref}$, $\overline{EFC_{0\to1}-EFC_{1\to0}}$ and $T_{avg}$ may be reset to 0. If the adjustment to $V_{ref}$ received from the one or more decoders 104, however, is the same as the adjustment to $V_{ref}$ stored in the memory 106, the $V_{ref}$ update controller 114 may update $\overline{EFC_{0\to1}-EFC_{1\to0}}$ and $T_{avg}$, and update the adjustment to $V_{ref}$ stored in the memory 106 accordingly.

Figure 3:
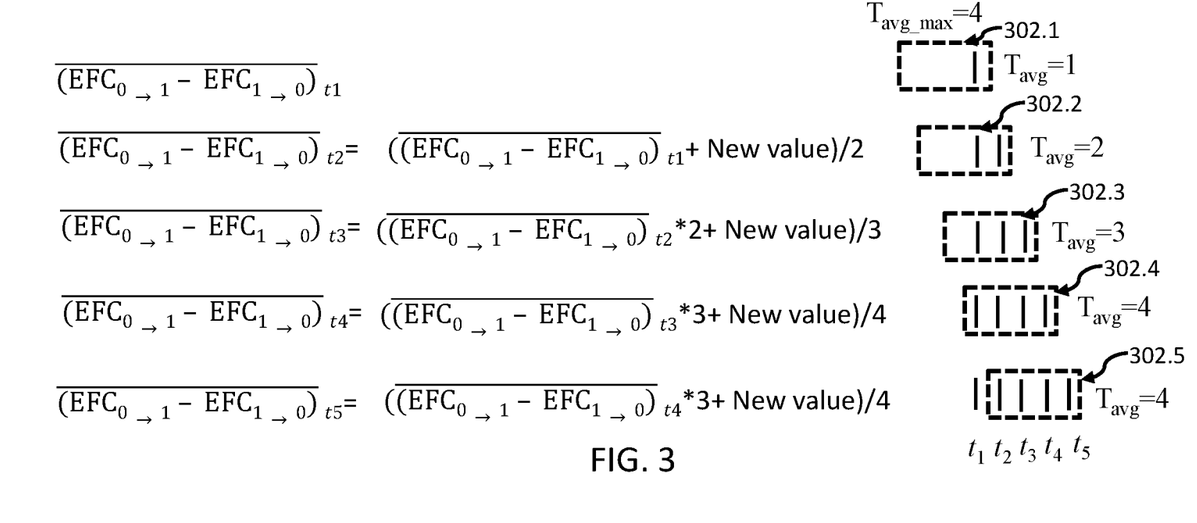
FIG. 3 schematically shows how historical decoding information is used in accordance with an embodiment of the present disclosure.

FIG. 3 schematically shows how historical decoding information is used in accordance with an embodiment of the present disclosure. In FIG. 3, the number of most recent decoding processes to be used for calculating $\overline{EFC_{0\to1}-EFC_{1\to0}}$ may be marked within a sliding window 302. In the example shown in FIG. 3, $T_{avg\_max}$ may be set to 4, which may be set to another positive number in other embodiments. At the time t1, the sliding window 302.1 may contain one decoding process (e.g., $T_{avg}=1$) for decoding a data block read from a storage location, and the difference between $EFC_{0\to1}$ and $EFC_{1\to0}$ obtained from this decoding process may be treated as the average of the difference at time t1 (e.g., $\overline{EFC_{0\to1}-EFC_{1\to0t1}}$). At the time t2, in addition to the decoding process at time t1, the sliding window 302.2 may contain another decoding process (e.g., $T_{avg}=2$) for decoding another data block read from the same storage location, and the difference between $EFC_{0\to1}$ and $EFC_{1\to0}$ obtained from the second decoding process may be used as the New Value to update the average of the difference and generate an updated average of the difference at time t2 (e.g., $\overline{EFC_{0\to1}-EFC_{1\to0t2}}=(\overline{EFC_{0\to1}-EFC_{1\to0t1}}+\text{New Value})/2$, in which "/" is the division operator).

At the time t3, further in addition to the decoding process at time t2, the sliding window 302.3 may contain yet another decoding process (e.g., $T_{avg}=3$) for decoding yet another data block read from the same storage location, and the difference between $EFC_{0\to1}$ and $EFC_{1\to0}$ obtained from third decoding process may be used as the New Value to update the average of the difference and generate an updated average of the difference at time t3 (e.g., $\overline{EFC_{0\to1}-EFC_{1\to0t3}}=((\overline{EFC_{0\to1}-EFC_{1\to0t2}})*2+\text{New Value})/3$, in which "*" is a multiplication operator). At the time t4, the sliding window 302.4 may reach the maximum number of most recent decoding processes with 4 decoding processes (e.g., $T_{avg}=4$) and the average of the difference between $EFC_{0\to1}$ and $EFC_{1\to0}$ may be updated as $\overline{EFC_{0\to1}-EFC_{1\to0t4}}=((\overline{EFC_{0\to1}-EFC_{1\to0t3}})*3+\text{New Value})/4$.

Then subsequently at the time t5, the sliding window 302.5 may maintain four most recent decoding processes (e.g., the decoding process at the time t1 is out) and the difference between $EFC_{0\to1}$ and $EFC_{1\to0}$ obtained from most recent decoding process may be used as the New Value to update the average of the difference and generate an updated average of the difference at time t5 $\overline{EFC_{0\to1}-EFC_{1\to0t5}}=((\overline{EFC_{0\to1}-EFC_{1\to0t2}})*3+\text{New Value})/4$.

Figure 4:
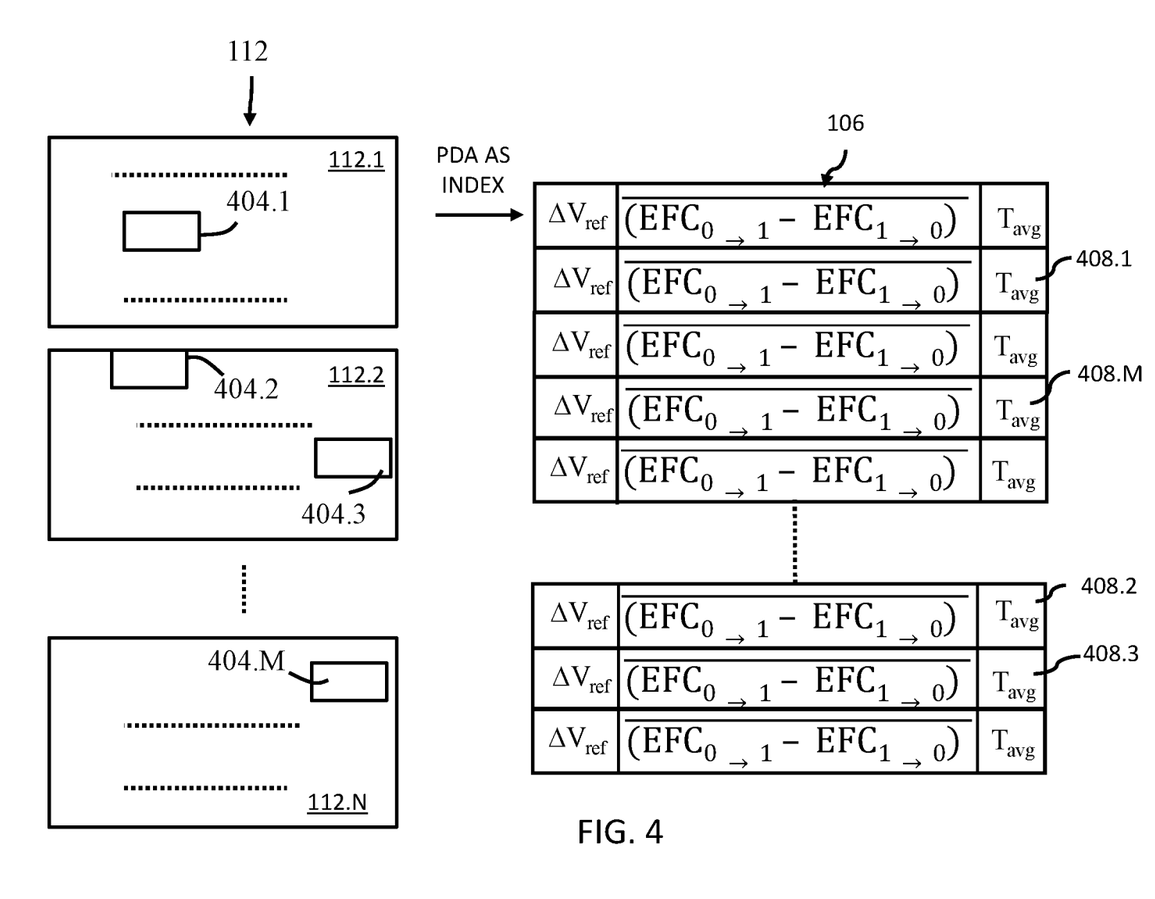
FIG. 4 schematically shows how adjustments to read reference voltage are stored in a memory in accordance with an embodiment of the present disclosure.

FIG. 4 schematically shows how adjustments to read reference voltage may be stored in the memory 106 in accordance with an embodiment of the present disclosure. The NAND devices 112 may comprise NAND devices 112.1 through 112.N with N being a positive integer. Each storage location for a data block may be associated with a unique identifier for the storage location (e.g., the PDA) and the unique identifier may be used as an index for adjustment to $V_{ref}$ stored in the memory 106. For example, the NAND device 112.1 may have a data block stored at the location 404.1, the NAND device 112.2 may have a data block stored at the location 404.2 and another block of data stored at the location 404.3, and the NAND device 112.N may have a block of data stored at the location 404.M with M larger than three.

For each storage location, the adjustment to $V_{ref}$, an average of the difference between $EFC_{0\to1}$ and $EFC_{1\to0}$ (e.g., $\overline{EFC_{0\to1}-EFC_{1\to0}}$) based on historical decoding processes and the number $T_{avg}$ used for calculating the average of the difference may be kept. These three pieces of information may also be collectively referred to as $V_{ref}$ adjustment information. In one embodiment, the $V_{ref}$ adjustment information may be kept in a table referred to as the $V_{ref}$ adjustment table. In FIG. 4, the adjustment to $V_{ref}$ may be denoted as $\Delta V_{ref}$. In the memory 106, the $V_{ref}$ adjustment information for data stored at the location 404.1 may be kept at 408.1 and associated with the unique identifier for the location 404.1. The $V_{ref}$ adjustment information for data stored at the location 404.2 may be kept at 408.2 and associated with another index value, which may be the unique identifier for the location 404.2. The $V_{ref}$ adjustment information for data stored at the location 404.3 may be kept at 408.3 and associated with its own index value, which may be the unique identifier for the location 404.3. Similarly, the $V_{ref}$ adjustment information for data stored at the location 404.M may be kept at 408.M and associated with its own index value, which may be the unique identifier for the location 404.M.

In some embodiments, due to size limit, the memory 106 may not be able to hold the $V_{ref}$ adjustment information for all storage locations of the NAND devices 112. That is, if a lot of storage locations' $V_{ref}$ adjustment information needs to be saved, the required memory size may exceed the size of the memory 106. In some embodiments, a caching approach may be used. For example, instead of saving $V_{ref}$ adjustment information for all NAND storage locations, $V_{ref}$ adjustment information for a subset of NAND storage locations (e.g., a number of J locations) may be kept in the memory 106. The rest may be stored in a non-volatile storage device (e.g., one of the NAND devices 112) and loaded into memory 106 when needed. There are various ways to choose the J storage locations. Any existing or future developed caching algorithms may be used. For example, these J storage locations may be storage locations most recently read or most recently have errors. In an embodiment that only $V_{ref}$ information for a subset of storage locations are loaded in the memory 106, the memory 106 may also store the unique identifiers for these storage locations.

Figure 5:
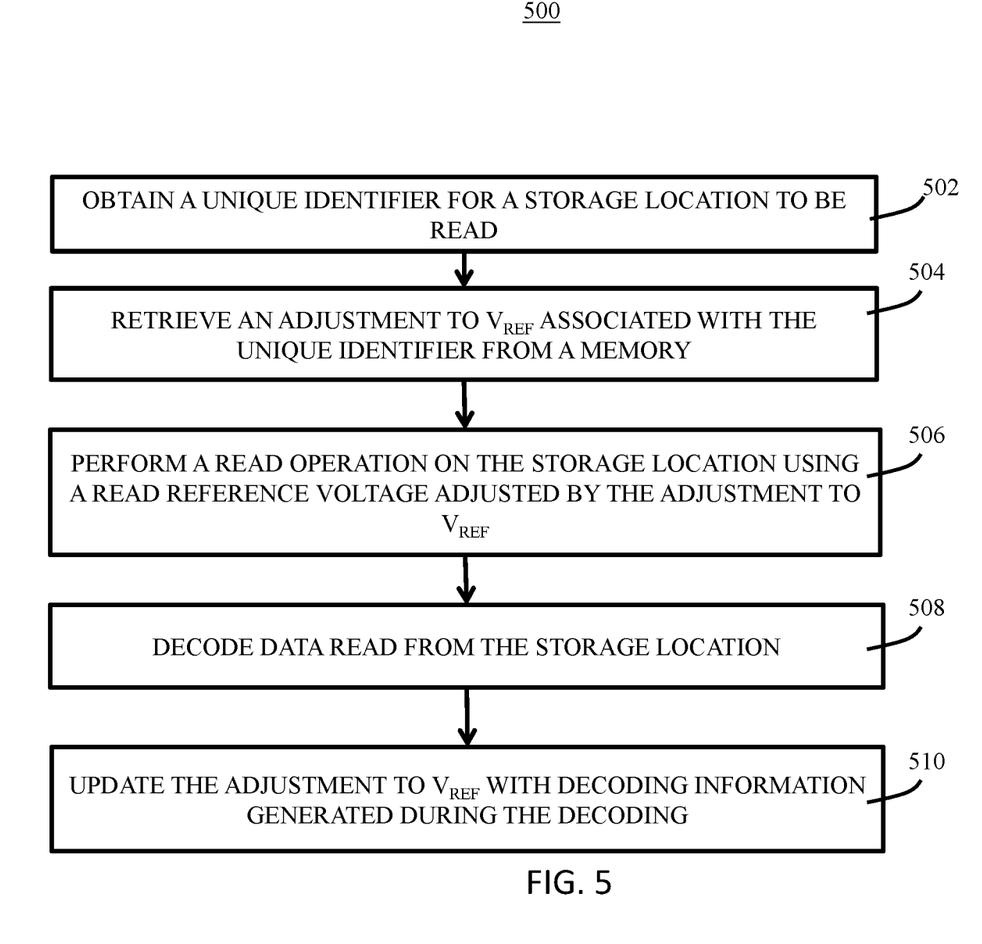
FIG. 5 is a flow diagram of a process for reading data in accordance with an embodiment of the present disclosure.

FIG. 5 is a flow chart for a process 500 to read a block of data using adjustment to $V_{ref}$ based on historical decoding information according to an embodiment. In block 502, a unique identifier for a storage location to be read may be obtained. For example, a host may issue a read command with a logical data address and a physical data address mapped to the logical data address may be obtained. The PDA may be a unique identifier for the storage location from where data may be read. In block 504, an adjustment to a read reference voltage associated with the unique identifier may be retrieved from a memory. In one embodiment, for example, the adjustment to $V_{ref}$ may be generated based on error flipping counts from one or more previous decoding processes on data previously read from the storage location and stored in a memory (e.g., memory 106). The $V_{ref}$ search controller 108 may use the PDA to search the memory 106 for an adjustment to $V_{ref}$ associated with the PDA and retrieve it.

In block 506, a read operation on the storage location may be performed using the read reference voltage adjusted by the adjustment. In one embodiment, for example, the NAND interface controller may receive the adjustment to $V_{ref}$ and the PDA, and issue a read command to a non-volatile storage device to perform the read operation, using the read reference voltage adjusted by the adjustment, at the storage location identified by the PDA.

In block 508, data read from the storage location may be decoded. In one embodiment, the one or more ECC decoders 104 may include at least one decoder to decode the data read from the storage location. In block 510, the adjustment to $V_{ref}$ may be updated with decoding information generated during the decoding. In one embodiment, the error flipping count of 0 to 1 and error flipping count of 1 to 0 in one decoding process may be sent to the $V_{ref}$ update controller 114, which may update an average of the difference between the two counts and update an adjustment to $V_{ref}$ based on the average of the difference between the two counts.

Figure 6:
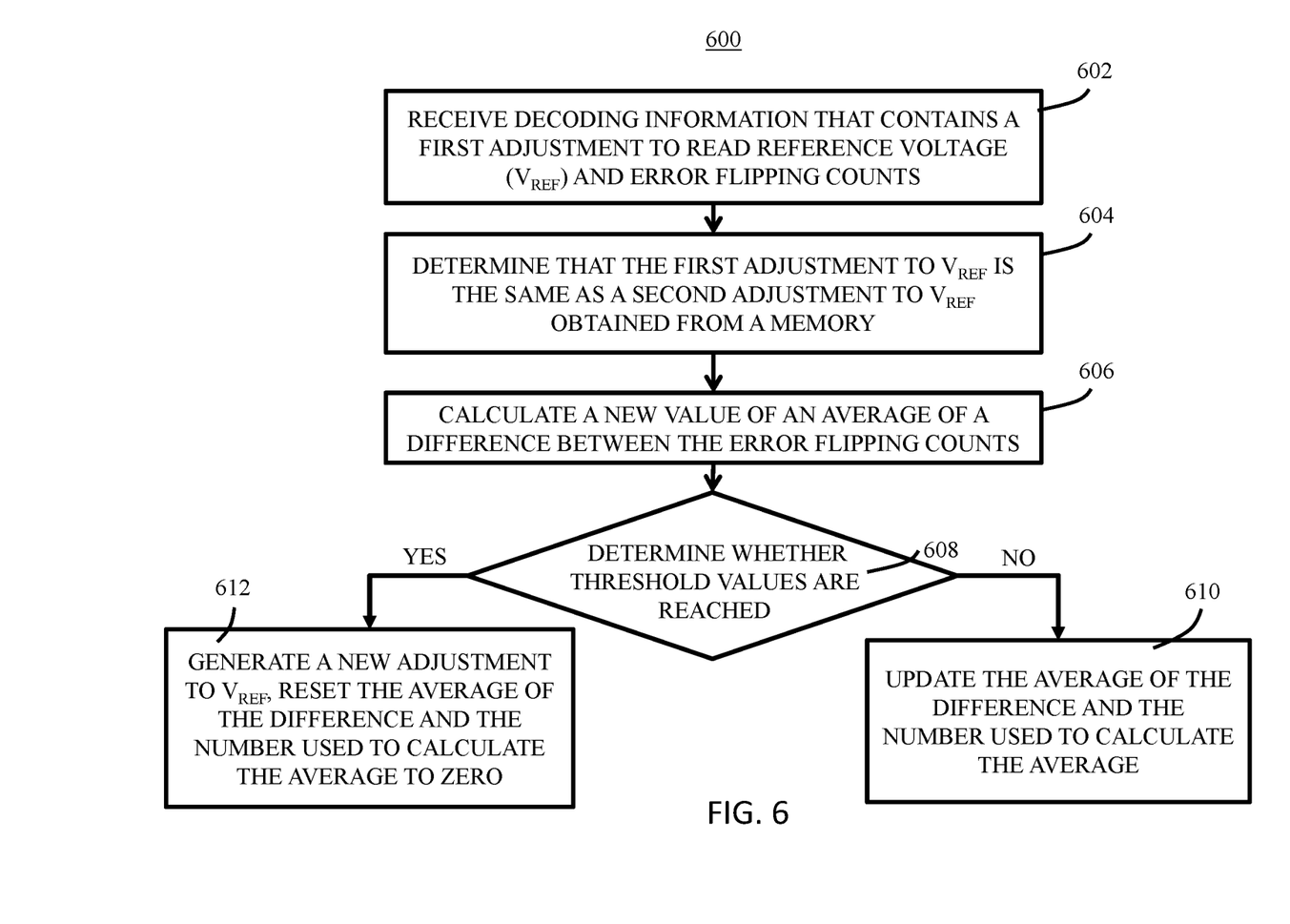
FIG. 6 is a flow diagram of a process for updating the read reference voltage information in accordance with an embodiment of the present disclosure.

FIG. 6 is a flow chart of a process 600 for updating adjustment to $V_{ref}$ based on historical decoding information according to an embodiment. In block 602, decoding information that contains a first adjustment to read reference voltage ($V_{ref}$) and error flipping counts may be received. For example, the $V_{ref}$ update controller 114 may receive decoding information from the one or more decoders 104 for decoding data read from a storage location identified by a unique identifier for the storage location. The decoding information may contain an adjustment to $V_{ref}$ and $EFC_{0\to1}$ and $EFC_{1\to0}$. The adjustment to $V_{ref}$ may be what has been used to read the data decoded in the decoding process.

In block 604, it may be determined that the first adjustment to $V_{ref}$ is the same as a second adjustment to $V_{ref}$ obtained from a memory. In some embodiments, the memory 106 may store a previously generated adjustment to $V_{ref}$ associated with the unique identifier. If the adjustment to $V_{ref}$ used to read the data is different from the previously generated adjustment to $V_{ref}$, the adjustment to $V_{ref}$ used to read the data may be generated elsewhere (e.g., by the controller executing firmware or the NAND device itself). Although the $V_{ref}$ update controller 114 may update the memory 106 with this adjustment to $V_{ref}$ used to read the data and reset $\overline{EFC_{0\to1}-EFC_{1\to0}}$ and $T_{avg}$ to 0, this is not part of the process 600. For the process 600, the $V_{ref}$ update controller 114 may determine that the adjustment to $V_{ref}$ used to read the data is the same as the adjustment to $V_{ref}$ stored in the memory 106.

In block 606, a new value of $\overline{EFC_{0\to1}-EFC_{1\to0}}$ may be calculated. For example, an updated average of the difference may be generated to incorporate the difference between $EFC_{0\to1}$ and $EFC_{1\to0}$ from the most recent decoding process and $T_{avg}$ may also be updated. In block 608, it may be determined whether threshold values are reached. For example, $T_{avg}$ may be compared to $T_{avg\_thr}$ and the absolute value of $\overline{EFC_{0\to1}-EFC_{1\to0}}$ may be compared to $EFC\_DIF-F_{thr}$, if either of the threshold value is not reached, the process 600 may continue to block 610. In block 610, the values for $\overline{EFC_{0\to1}-EFC_{1\to0}}$ and $T_{avg}$ may be updated. For example, the memory record associated with the unique identifier may be updated with the values for $\overline{EFC_{0\to1}-EFC_{1\to0}}$ and $T_{avg}$. If both threshold values are reached, the process 600 may continue to block 612, in which an updated adjustment to $V_{ref}$ may be generated, and $\overline{EFC_{0\to1}-EFC_{1\to0}}$ and $T_{avg}$ may be reset to 0. The values generated or set in block 612 may also be stored in the memory 106 for future use.

Embodiments of the processes disclosed herein (including the processes 500 and 600 in whole or in part) may be implemented using software (e.g., executable by a computer processor (e.g., a central processing unit (CPU), a graphics processing unit (GPU), or both)), hardware (e.g., a field-programmable gate array (FPGA) or an application-specific IC (ASIC), firmware, or any suitable combination of the three.

In an exemplary embodiment, there is provided a method that may comprise obtaining a unique identifier for a storage location to be read, retrieving from a memory an adjustment to read reference voltage ($V_{ref}$) associated with the unique identifier, performing a read operation on the storage location using a read reference voltage adjusted by the adjustment to $V_{ref}$, decoding data read from the storage location in a decoding process, and updating the adjustment to $V_{ref}$ with decoding information generated during the decoding process.

In one embodiment, the decoding information may include another adjustment to $V_{ref}$ that is different from the adjustment to $V_{ref}$ stored in the memory and updating the adjustment to $V_{ref}$ may include replace the adjustment to $V_{ref}$ stored in the memory with the another adjustment to $V_{ref}$.

In one embodiment, the decoding information may include another adjustment to $V_{ref}$, an error flipping count of zero to one ($EFC_{0\to1}$) and an error flipping count of one to zero ($EFC_{1\to0}$), and updating the adjustment to $V_{ref}$ may include: determining that the another adjustment to $V_{ref}$ included in the decoding information is the same as the adjustment to $V_{ref}$ stored in the memory; calculating a new value of an average of difference between $EFC_{0\to1}$ and $EFC_{1\to0}$, the average being calculated over a number of most recent decoding processes; determining that threshold values for the average of difference between $EFC_{0\to1}$ and $EFC_{1\to0}$ and the number of most recent decoding processes used for calculating the average are reached; generating a new adjustment to $V_{ref}$ and resetting the average of difference between $EFC_{0\to1}$ and $EFC_{1\to0}$ and the number of most recent decoding processes used for calculating the average to zero; and storing the new adjustment to $V_{ref}$, zero for the average of difference between $EFC_{0\to1}$ and $EFC_{1\to0}$ and zero for the number of most recent decoding processes used for calculating the average to the memory.

In one embodiment, the decoding information may include another adjustment to $V_{ref}$, an error flipping count of zero to one ($EFC_{0\to1}$) and an error flipping count of one to zero ($EFC_{1\to0}$), and updating the adjustment to $V_{ref}$ may include: determining that the another adjustment to $V_{ref}$ included in the decoding information is the same as the adjustment to $V_{ref}$ stored in the memory; calculating a new value of an average of difference between $EFC_{0\to1}$ and $EFC_{1\to0}$, the average being calculated over a number of most recent decoding processes; determining that at least one of the new value of the average of difference between $EFC_{0\to1}$ and $EFC_{1\to0}$ and the number of most recent decoding processes used for calculating the average has not reached its respective threshold value; and updating a memory record with the new value of the average of difference between $EFC_{0\to1}$ and $EFC_{1\to0}$ and the number of most recent decoding processes used for calculating the average.

In one embodiment, the decoding information may include an error flipping count of zero to one ($EFC_{0\to1}$) and an error flipping count of one to zero ($EFC_{1\to0}$), and updating the adjustment to $V_{ref}$ may include: calculating a new value of an average of difference between $EFC_{0\to1}$ and $EFC_{1\to0}$, the average being calculated over a number of most recent decoding processes, determining whether threshold values for the average of difference between $EFC_{0\to1}$ and $EFC_{1\to0}$ and the number of most recent decoding processes used for calculating the average are reached, if both of the threshold values are reached, generating a new adjustment to $V_{ref}$ and resetting the average of difference between $EFC_{0\to1}$ and $EFC_{1\to0}$ and the number of most recent decoding processes used for calculating the average to zero and if either of the threshold values is not reached, updating a memory record with the new value of the average of difference between $EFC_{0\to1}$ and $EFC_{1\to0}$ and the number of most recent decoding processes used for calculating the average.

In one embodiment, the decoding information may further include another adjustment to $V_{ref}$, and updating the adjustment to $V_{ref}$ may further include determining that the another adjustment to $V_{ref}$ included in the decoding information is the same as the adjustment to $V_{ref}$ stored in the memory.

In one embodiment, the memory may store the adjustment to $V_{ref}$ using the unique identifier for the storage location as an index.

In one embodiment, the unique identifier for the storage location may be a physical data address (PDA).

In one embodiment, the method may further comprise caching the adjustment to $V_{ref}$ with a caching algorithm.

In another embodiment, there is provided a storage system controller that may comprise a logical data address (LDA) to physical data address (PDA) mapper configured to obtain a PDA for a LDA, a read reference voltage ($V_{ref}$) search controller configured to retrieve from a memory an adjustment to $V_{ref}$ associated with the PDA, a NAND interface controller configured to issue a read command to read a storage location identified by the PDA, one or more ECC decoders configured to decode data read by the read command in a decoding process, and a $V_{ref}$ update controller configured to update the adjustment to $V_{ref}$ with decoding information generated during the decoding process.

In one embodiment, the decoding information may include another adjustment to $V_{ref}$ that is different from the adjustment to $V_{ref}$ stored in the memory and to update the adjustment to $V_{ref}$ may include replace the adjustment to $V_{ref}$ stored in the memory with the another adjustment to $V_{ref}$.

In one embodiment, the decoding information may include another adjustment to $V_{ref}$, an error flipping count of zero to one ($EFC_{0\to1}$) and an error flipping count of one to zero ($EFC_{1\to0}$), and wherein to update the adjustment to $V_{ref}$ may include: determine that the another adjustment to $V_{ref}$ included in the decoding information is the same as the adjustment to $V_{ref}$ stored in the memory; calculate a new value of an average of difference between $EFC_{0\to1}$ and $EFC_{1\to0}$, the average being calculated over a number of most recent decoding processes; determine that threshold values for the average of difference between $EFC_{0\to1}$ and $EFC_{1\to0}$ and the number of most recent decoding processes used for calculating the average are reached; generate a new adjustment to $V_{ref}$ and reset the average of difference between $EFC_{0\to1}$ and $EFC_{1\to0}$ and the number of most recent decoding processes used for calculating the average to zero; and store the new adjustment to $V_{ref}$, zero for the average of difference between $EFC_{0\to1}$ and $EFC_{1\to0}$ and zero for the number of most recent decoding processes used for calculating the average to the memory.

In one embodiment, the decoding information may include another adjustment to $V_{ref}$, an error flipping count of zero to one ($EFC_{0\to1}$) and an error flipping count of one to zero ($EFC_{1\to0}$), and to update the adjustment to $V_{ref}$ may include: determine that the another adjustment to $V_{ref}$ included in the decoding information is the same as the adjustment to $V_{ref}$ stored in the memory; calculate a new value of an average of difference between $EFC_{0\to1}$ and $EFC_{1\to0}$, the average being calculated over a number of most recent decoding processes; determine that at least one of the new value of the average of difference between $EFC_{0\to1}$ and $EFC_{1\to0}$ and the number of most recent decoding processes used for calculating the average has not reached its respective threshold value; and update a memory record with the new value of the average of difference between $EFC_{0\to1}$ and $EFC_{1\to0}$ and the number of most recent decoding processes used for calculating the average.

In one embodiment, the decoding information may include an error flipping count of zero to one ($EFC_{0\to1}$) and an error flipping count of one to zero ($EFC_{1\to0}$), and to update the adjustment to $V_{ref}$ may include to: calculate a new value of an average of difference between $EFC_{0\to1}$ and $EFC_{1\to0}$, the average being calculated over a number of most recent decoding processes, determine whether threshold values for the average of difference between $EFC_{0\to1}$ and $EFC_{1\to0}$ and the number of most recent decoding processes used for calculating the average are reached, if both of the threshold values are reached, generate a new adjustment to $V_{ref}$ and reset the average of difference between $EFC_{0\to1}$ and $EFC_{1\to0}$ and the number of most recent decoding processes used for calculating the average to zero, and if either of the threshold values is not reached, update a memory record with the new value of the average of difference between $EFC_{0\to1}$ and $EFC_{1\to0}$ and the number of most recent decoding processes used for calculating the average.

In one embodiment, the decoding information may further include another adjustment to $V_{ref}$, and to update the adjustment to $V_{ref}$ may further include to determine that the another adjustment to $V_{ref}$ included in the decoding information is the same as the adjustment to $V_{ref}$ stored in the memory.

In yet another exemplary embodiment, disclosed herein may also include a non-transitory machine-readable medium having executable instructions. The executable instructions, when executed by a storage controller, may cause the storage controller to: obtain a unique identifier for a storage location to be read, retrieve from a memory an adjustment to read reference voltage ($V_{ref}$) associated with the unique identifier, perform a read operation on the storage location using a read reference voltage adjusted by the adjustment to $V_{ref}$, decode data read from the storage location in a decoding process, and update the adjustment to $V_{ref}$ with decoding information generated during the decoding process.

In one embodiment, the decoding information may include another adjustment to $V_{ref}$ that is different from the adjustment to $V_{ref}$ stored in the memory and to update the adjustment to $V_{ref}$ may include replace the adjustment to $V_{ref}$ stored in the memory with the another adjustment to $V_{ref}$.

In one embodiment, the decoding information may include another adjustment to $V_{ref}$, an error flipping count of zero to one ($EFC_{0\to1}$) and an error flipping count of one to zero ($EFC_{1\to0}$), and to update the adjustment to $V_{ref}$ may include to: determine that the another adjustment to $V_{ref}$ included in the decoding information is the same as the adjustment to $V_{ref}$ stored in the memory; calculate a new value of an average of difference between $EFC_{0\to1}$ and $EFC_{1\to 0}$, the average being calculated over a number of most recent decoding processes; determine that threshold values for the average of difference between $EFC_{0\to 1}$ and $EFC_{1\to 0}$ and the number of most recent decoding processes used for calculating the average are reached; generating a new adjustment to $V_{ref}$ and resetting the average of difference between $EFC_{0\to 1}$ and $EFC_{1\to 0}$ and the number of most recent decoding processes used for calculating the average to zero; and store the new adjustment to $V_{ref}$, zero for the average of difference between $EFC_{0\to 1}$ and $EFC_{1\to 0}$ and zero for the number of most recent decoding processes used for calculating the average to the memory.

In one embodiment, the decoding information may include another adjustment to $V_{ref}$, an error flipping count of zero to one ($EFC_{0\to 1}$) and an error flipping count of one to zero ($EFC_{1\to 0}$), and to update the adjustment to $V_{ref}$ may include to: determine that the another adjustment to $V_{ref}$ included in the decoding information is the same as the adjustment to $V_{ref}$ stored in the memory; calculate a new value of an average of difference between $EFC_{0\to 1}$ and $EFC_{1\to 0}$, the average being calculated over a number of most recent decoding processes; determine that at least one of the new value of the average of difference between $EFC_{0\to 1}$ and $EFC_{1\to 0}$ and the number of most recent decoding processes used for calculating the average has not reached its respective threshold value; and update a memory record with the new value of the average of difference between $EFC_{0\to 1}$ and $EFC_{1\to 0}$ and the number of most recent decoding processes used for calculating the average.

In one embodiment, the decoding information may include an error flipping count of zero to one ($EFC_{0\to 1}$) and an error flipping count of one to zero ($EFC_{1\to 0}$), and to update adjustment to $V_{ref}$ may include to: calculate a new value of an average of difference between $EFC_{0\to 1}$ and $EFC_{1\to 0}$, the average being calculated over a number of most recent decoding processes, determine whether threshold values for the average of difference between $EFC_{0\to 1}$ and $EFC_{1\to 0}$ and the number of most recent decoding processes used for calculating the average are reached, if both of the threshold values are reached, generate a new adjustment to $V_{ref}$ and reset the average of difference between $EFC_{0\to 1}$ and $EFC_{1\to 0}$ and the number of most recent decoding processes used for calculating the average to zero, and if either of the threshold values is not reached, update a memory record with the new value of the average of difference between $EFC_{0\to 1}$ and $EFC_{1\to 0}$ and the number of most recent decoding processes used for calculating the average.

In one embodiment, for example, some or all of the disclosed methods and operations may be implemented in software comprising computer-executable instructions stored on one or more computer-readable storage media. The one or more computer-readable storage media may include non-transitory computer-readable media (such as removable or non-removable magnetic disks, magnetic tapes or cassettes, solid state drives (SSDs), hybrid hard drives, CD-ROMs, CD-RWs, DVDs, or any other tangible storage medium), volatile memory components (such as DRAM or SRAM), or nonvolatile memory components (such as hard drives)). The computer-executable instructions may be executed on a computer (e.g., any commercially available computer, including smart phones or other mobile devices that include computing hardware) by a computer processor (e.g., a CPU, a GPU, or both). Any of the computer-executable instructions for implementing the disclosed techniques as well as any data created and used during implementation of the disclosed embodiments may be stored on one or more computer-readable media (e.g., non-transitory computer-readable media).

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method, comprising:
   obtaining a unique identifier for a storage location to be read;
   retrieving from a memory an adjustment to read reference voltage ($V_{ref}$) associated with the unique identifier;
   performing a read operation on the storage location using a read reference voltage adjusted by the adjustment to $V_{ref}$;
   decoding data read from the storage location in a decoding process; and
   updating the adjustment to $V_{ref}$ in the memory, with decoding information generated during the decoding process;
   wherein the decoding information includes another adjustment to $V_{ref}$, an error flipping count of zero to one ($EFC_{0\to 1}$) and an error flipping count of one to zero ($EFC_{1\to 0}$), and updating the adjustment to $V_{ref}$ includes: determining that the another adjustment to $V_{ref}$ included in the decoding information is the same as the adjustment to $V_{ref}$ stored in the memory; calculating a new value of an average of difference between $EFC_{0\to 1}$ and $EFC_{1\to 0}$, the average being calculated over a number of most recent decoding processes; determining that threshold values for the average of difference between $EFC_{0\to 1}$ and $EFC_{1\to 0}$ and the number of most recent decoding processes used for calculating the average are reached; generating a new adjustment to $V_{ref}$ and resetting the average of difference between $EFC_{0\to 1}$ and $EFC_{1\to 0}$ and the number of most recent decoding processes used for calculating the average to zero; and storing the new adjustment to $V_{ref}$, zero for the average of difference between $EFC_{0\to 1}$ and $EFC_{1\to 0}$ and zero for the number of most recent decoding processes used for calculating the average to the memory; or
   wherein the decoding information includes another adjustment to $V_{ref}$, an error flipping count of zero to one ($EFC_{0\to 1}$) and an error flipping count of one to zero ($EFC_{1\to 0}$), and updating the adjustment to $V_{ref}$ includes: determining that the another adjustment to $V_{ref}$ included in the decoding information is the same as the adjustment to $V_{ref}$ stored in the memory; calculating a new value of an average of difference between $EFC_{0\to 1}$ and $EFC_{1\to 0}$, the average being calculated over a number of most recent decoding processes; determining that at least one of the new value of the average of difference between $EFC_{0\to 1}$ and $EFC_{1\to 0}$ and the number of most recent decoding processes used for calculating the average has not reached its respective threshold value; and updating a memory record with the new value of the average of difference between $EFC_{0\to 1}$ and $EFC_{1\to 0}$ and the number of most recent decoding processes used for calculating the average; or
   wherein the decoding information includes an error flipping count of zero to one ($EFC_{0\to 1}$) and an error flipping count of one to zero ($EFC_{1\to 0}$), and updating the adjustment to $V_{ref}$ includes: calculating a new value of an average of difference between $EFC_{0\to1}$ and $EFC_{0\to1}$ the average being calculated over a number of most recent decoding processes; determining whether threshold values for the average of difference between $EFC_{0\to1}$ and $EFC_{1\to0}$ and the number of most recent decoding processes used for calculating the average are reached; if both of the threshold values are reached, generating a new adjustment to $V_{ref}$ and resetting the average of difference between $EFC_{0\to1}$ and $EFC_{1\to0}$ and the number of most recent decoding processes used for calculating the average to zero; and if either of the threshold values is not reached, updating a memory record with the new value of the average of difference between $EFC_{0\to1}$ and $EFC_{1\to0}$ and the number of most recent decoding processes used for calculating the average.

2. The method of claim 1, wherein the decoding information includes another adjustment to $V_{ref}$ that is different from the adjustment to $V_{ref}$ stored in the memory and updating the adjustment to $V_{ref}$ includes replace the adjustment to $V_{ref}$ stored in the memory with the another adjustment to $V_{ref}$.

3. The method of claim 1, wherein the decoding information further includes another adjustment to $V_{ref}$, and wherein updating the adjustment to $V_{ref}$ further includes: determining that the another adjustment to $V_{ref}$ included in the decoding information is the same as the adjustment to $V_{ref}$ stored in the memory.

4. The method of claim 1, wherein the memory stores the adjustment to $V_{ref}$ using the unique identifier for the storage location as an index.

5. The method of claim 1, wherein the unique identifier for the storage location is a physical data address (PDA).

6. The method of claim 1, further comprising caching the adjustment to $V_{ref}$ with a caching algorithm.

7. A storage system controller, comprising:
a logical data address (LDA) to physical data address (PDA) mapper configured to obtain a PDA for a LDA;
a read reference voltage ($V_{ref}$) search controller configured to retrieve from a memory an adjustment to $V_{ref}$ associated with the PDA;
a NAND interface controller configured to issue a read command to read a storage location identified by the PDA;
one or more ECC decoders configured to decode data read by the read command in a decoding process; and
a $V_{ref}$ update controller configured to update the adjustment to $V_{ref}$ in the memory, with decoding information generated during the decoding process;
wherein the decoding information includes another adjustment to $V_{ref}$, an error flipping count of zero to one ($EFC_{0\to1}$) and an error flipping count of one to zero ($EFC_{1\to0}$), and wherein to update the adjustment to $V_{ref}$ includes to:
determine that the another adjustment to $V_{ref}$ included in the decoding information is the same as the adjustment to $V_{ref}$ stored in the memory;
calculate a new value of an average of difference between $EFC_{0\to1}$ and $EFC_{1\to0}$, the average being calculated over a number of most recent decoding processes;
determine that threshold values for the average of difference between $EFC_{0\to1}$ and $EFC_{1\to0}$ and the number of most recent decoding processes used for calculating the average are reached:
generate a new adjustment to $V_{ref}$ and reset the average of difference between $EFC_{0\to1}$ and $EFC_{1\to0}$ and the number of most recent decoding processes used for calculating the average to zero; and
store the new adjustment to $V_{ref}$, zero for the average of difference between $EFC_{0\to1}$ and $EFC_{1\to0}$ and zero for the number of most recent decoding processes used for calculating the average to the memory.

8. The storage system controller of claim 7, wherein the decoding information includes another adjustment to $V_{ref}$ that is different from the adjustment to $V_{ref}$ stored in the memory and to update the adjustment to $V_{ref}$ includes replace the adjustment to $V_{ref}$ stored in the memory with the another adjustment to $V_{ref}$.

9. A storage system controller, comprising:
a logical data address (LDA) to physical data address (PDA) mapper configured to obtain a PDA for a LDA;
a read reference voltage ($V_{ref}$) search controller configured to retrieve from a memory an adjustment to $V_{ref}$ associated with the PDA;
a NAND interface controller configured to issue a read command to read a storage location identified by the PDA;
one or more ECC decoders configured to decode data read by the read command in a decoding process; and
a $V_{ref}$ update controller configured to update the adjustment to $V_{ref}$ in the memory, with decoding information generated during the decoding process;
wherein the decoding information includes another adjustment to $V_{ref}$, an error flipping count of zero to one ($EFC_{0\to1}$) and an error flipping count of one to zero ($EFC_{1\to0}$), and wherein to update the adjustment to $V_{ref}$ includes to:
determine that the another adjustment to $V_{ref}$ included in the decoding information is the same as the adjustment to $V_{ref}$ stored in the memory;
calculate a new value of an average of difference between $EFC_{0\to1}$ and $EFC_{1\to0}$, the average being calculated over a number of most recent decoding processes;
determine that at least one of the new value of the average of difference between $EFC_{0\to1}$ and $EFC_{1\to0}$ and the number of most recent decoding processes used for calculating the average has not reached its respective threshold value; and
update a memory record with the new value of the average of difference between $EFC_{0\to1}$ and $EFC_{1\to0}$ and the number of most recent decoding processes used for calculating the average.

10. A storage system controller, comprising:
a logical data address (LDA) to physical data address (PDA) mapper configured to obtain a PDA for a LDA;
a read reference voltage ($V_{ref}$) search controller configured to retrieve from a memory an adjustment to $V_{ref}$ associated with the PDA;
a NAND interface controller configured to issue a read command to read a storage location identified by the PDA;
one or more ECC decoders configured to decode data read by the read command in a decoding process; and
a $V_{ref}$ update controller configured to update the adjustment to $V_{ref}$ in the memory, with decoding information generated during the decoding process;
wherein the decoding information includes an error flipping count of zero to one ($EFC_{0\to1}$) and an error flipping count of one to zero ($EFC_{1\to0}$), and wherein to update the adjustment to $V_{ref}$ includes to:
calculate a new value of an average of difference between $EFC_{0\to1}$ and $EFC_{1\to0}$, the average being calculated over a number of most recent decoding processes;

determine whether threshold values for the average of difference between $EFC_{0\to1}$ and $EFC_{1\to0}$ and the number of most recent decoding processes used for calculating the average are reached;

if both of the threshold values are reached, generate a new adjustment to $V_{ref}$ and reset the average of difference between $EFC_{0\to1}$ and $EFC_{1\to0}$ and the number of most recent decoding processes used for calculating the average to zero; and if either of the threshold values is not reached, update a memory record with the new value of the average of difference between $EFC_{0\to1}$ and $EFC_{1\to0}$ and the number of most recent decoding processes used for calculating the average.

11. The storage system controller of claim 10, wherein the decoding information further includes another adjustment to $V_{ref}$, and wherein to update the adjustment to $V_{ref}$ further includes to determine that the another adjustment to $V_{ref}$ included in the decoding information is the same as the adjustment to $V_{ref}$ stored in the memory.

12. A non-transitory machine-readable medium having executable instructions, wherein the executable instructions, when executed by a storage controller, causes the storage controller to:

obtain a unique identifier for a storage location to be read;
retrieve from a memory an adjustment to read reference voltage ($V_{ref}$) associated with the unique identifier;
perform a read operation on the storage location using a read reference voltage adjusted by the adjustment to $V_{ref}$;
decode data read from the storage location in a decoding process; and
update the adjustment to $V_{ref}$ in the memory, with decoding information generated during the decoding process;
wherein the decoding information includes another adjustment to $V_{ref}$, an error flipping count of zero to one ($EFC_{0\to1}$) and an error flipping count of one to zero ($EFC_{1\to0}$), and to update the adjustment to $V_{ref}$ includes to: determine that the another adjustment to $V_{ref}$ included in the decoding information is the same as the adjustment to $V_{ref}$ stored in the memory; calculate a new value of an average of difference between $EFC_{0\to1}$ and $EFC_{1\to0}$, the average being calculated over a number of most recent decoding processes; determine that threshold values for the average of difference between $EFC_{0\to1}$ and $EFC_{1\to0}$ and the number of most recent decoding processes used for calculating the average are reached; generating a new adjustment to $V_{ref}$ and resetting the average of difference between $EFC_{0\to1}$ and $EFC_{1\to0}$ and the number of most recent decoding processes used for calculating the average to zero; and store the new adjustment to Viet, zero for the average of difference between $EFC_{0\to1}$ and $EFC_{1\to0}$ and zero for the number of most recent decoding processes used for calculating the average to the memory; or wherein the decoding information includes another adjustment to $V_{ref}$, an error flipping count of zero to one ($EFC_{0\to1}$) and an error flipping count of one to zero ($EFC_{1\to0}$), and to update the adjustment to $V_{ref}$ includes to: determine that the another adjustment to $V_{ref}$ included in the decoding information is the same as the adjustment to $V_{ref}$ stored in the memory; calculate a new value of an average of difference between $EFC_{0\to1}$ and $EFC_{1\to0}$ the average being calculated over a number of most recent decoding processes; determine that at least one of the new value of the average of difference between $EFC_{0\to1}$ and $EFC_{1\to0}$ and the number of most recent decoding processes used for calculating the average has not reached its respective threshold value; and update a memory record with the new value of the average of difference between $EFC_{0\to1}$ and $EFC_{1\to0}$ and the number of most recent decoding processes used for calculating the average; or wherein the decoding information includes an error flipping count of zero to one ($EFC_{0\to1}$) and an error flipping count of one to zero ($EFC_{1\to0}$), and wherein to update the adjustment to $V_{ref}$ includes to: calculate a new value of an average of difference between $EFC_{0\to1}$ and $EFC_{1\to0}$, the average being calculated over a number of most recent decoding processes; determine whether threshold values for the average of difference between $EFC_{0\to1}$ and $EFC_{1\to0}$ and the number of most recent decoding processes used for calculating the average are reached; if both of the threshold values are reached, generate a new adjustment to $V_{ref}$ and reset the average of difference between $EFC_{0\to1}$ and $EFC_{1\to0}$ and the number of most recent decoding processes used for calculating the average to zero; and if either of the threshold values is not reached, update a memory record with the new value of the average of difference between $EFC_{0\to1}$ and $EFC_{1\to0}$ and the number of most recent decoding processes used for calculating the average.

13. The non-transitory machine-readable medium of claim 12, wherein the decoding information includes another adjustment to $V_{ref}$ that is different from the adjustment to $V_{ref}$ stored in the memory and to update the adjustment to $V_{ref}$ includes replace the adjustment to $V_{ref}$ stored in the memory with the another adjustment to $V_{ref}$.

14. The storage system controller of claim 9, wherein the decoding information includes another adjustment to $V_{ref}$ that is different from the adjustment to $V_{ref}$ stored in the memory and to update the adjustment to $V_{ref}$ includes replace the adjustment to $V_{ref}$ stored in the memory with the another adjustment to $V_{ref}$.

15. The storage system controller of claim 10, wherein the decoding information includes another adjustment to $V_{ref}$ that is different from the adjustment to $V_{ref}$ stored in the memory and to update the adjustment to $V_{ref}$ includes replace the adjustment to $V_{ref}$ stored in the memory with the another adjustment to $V_{ref}$.

\* \* \* \* \*